United States Patent
Nasu et al.

(10) Patent No.: US 9,583,857 B2
(45) Date of Patent: Feb. 28, 2017

(54) ELECTRICAL CONTACTOR AND ELECTRICAL CONNECTING APPARATUS

(71) Applicant: KABUSHIKI KAISHA NIHON MICRONICS, Tokyo (JP)

(72) Inventors: Mika Nasu, Tokyo (JP); Darren Russell Aaberge, Tokyo (JP); Hiroyasu Ando, Tokyo (JP)

(73) Assignee: KABUSHIKI KAISHA MIHON MICRONICS, Tokyo (JP)

( * ) Notice: Subject to any disclaimer, the term of this patent is extended or adjusted under 35 U.S.C. 154(b) by 0 days.

(21) Appl. No.: 14/716,337

(22) Filed: May 19, 2015

(65) Prior Publication Data

US 2016/0118738 A1    Apr. 28, 2016

(30) Foreign Application Priority Data

Oct. 22, 2014    (JP) .................................. 2014-215311

(51) Int. Cl.
*H01R 13/24*    (2006.01)
*G01R 1/067*    (2006.01)

(52) U.S. Cl.
CPC ..... *H01R 13/2421* (2013.01); *G01R 1/06722* (2013.01)

(58) Field of Classification Search
CPC .. G01R 1/06722; G01R 3/00; G01R 1/06738; G01R 1/07314; H01R 13/2421
See application file for complete search history.

(56) References Cited

U.S. PATENT DOCUMENTS 5,982,187 A * 11/1999 Tarzwell ............ G01R 1/06722
324/72.5

2013/0057309 A1 * 3/2013 Kojima .................... C25D 1/02
324/755.05

FOREIGN PATENT DOCUMENTS

| JP | 2011-058880 A | 3/2011 |
| JP | 2013-007730 A | 1/2013 |
| KR | 20-2009 0008319 | 8/2009 |

OTHER PUBLICATIONS

Notification of Reasons for Refusal Issued Sep. 21, 2016 in Korean Patent Appln. No. 2015-0086373.
Extended European Search Report Issued Apr. 6, 2016 in Corresponding Application No. 15189041.5-1568.

* cited by examiner

*Primary Examiner* — James Harvey
*Assistant Examiner* — Oscar C Jimenez
(74) *Attorney, Agent, or Firm* — Bacon & Thomas, PLLC

(57) ABSTRACT

An object of the present invention is to provide an electrical contactor highly resistant to deformation capable of achieving satisfactory performance of electrical contact with a small number of elements.

An electrical contactor of this invention includes a barrel having a spring part achieving a spring function formed in a partial section, and a first plunger and a second plunger inserted in the barrel through an opening at one end and an opening at an opposite end of the barrel and fixed to the barrel. It is preferable that an end part of the first plunger in the barrel and an end part of the second plunger in the barrel are placed in internal space of the same non-spring part not to achieve a spring function. It is preferable that the barrel has three or more spring parts separated while non-spring parts are placed between the spring parts.

5 Claims, 10 Drawing Sheets

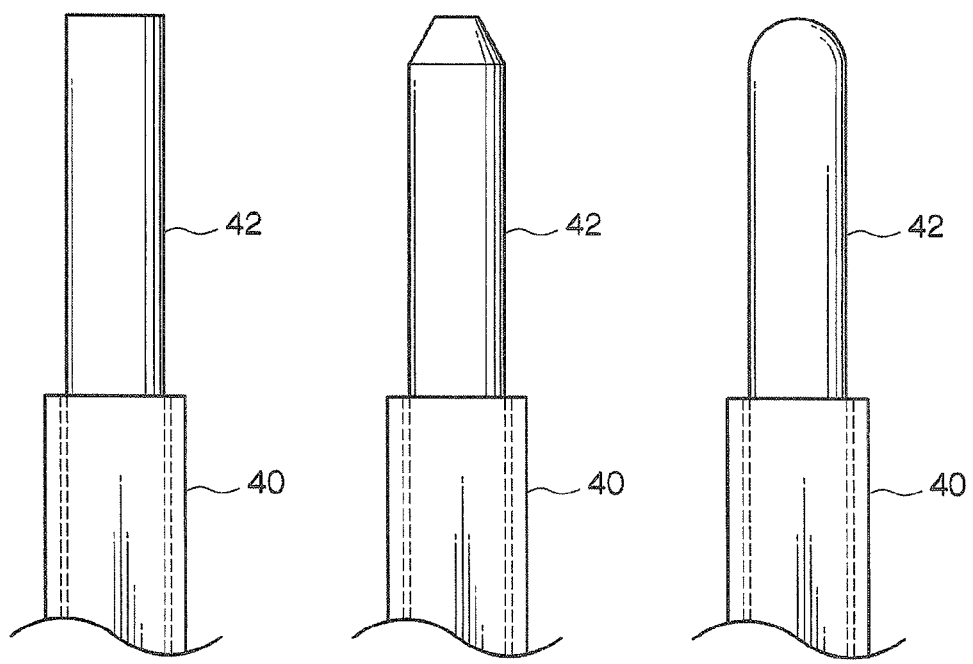

FIG.6

| THE NUMBER OF SPRING PARTS | DEFORMATION AMOUNT ($\mu$m) |
|---|---|
| 1 | 442.34 |
| 2 | 170.51 |
| 3 | 10.75 |
| 4 | 7.20 |
| 5 | 4.28 |

US 9,583,857 B2

ELECTRICAL CONTACTOR AND ELECTRICAL CONNECTING APPARATUS

CROSS-REFERENCE TO RELATED APPLICATION

This application claims, under 35 USC 119, priority of Japanese Application No. 2014-215311 filed on Oct. 22, 2014.

BACKGROUND OF THE INVENTION

1. Technical Field Relating to the Invention

This invention relates to an electrical contactor and an electrical connecting apparatus that are for example applicable as an electrical contactor to contact an electrode provided in a wiring substrate, a semiconductor integrated circuit or the like and an electrical connecting apparatus having multiple electrical contactors.

2. Background of Related Art

A well-known electrical contactor is to electrically connect electrical circuits on wiring substrates arranged to face each other, for example. An example of such an electrical contactor can be found in patent document 1 (Japanese Patent Laid-Open No. 2013-7730) (in patent document 1, the electrical contactor is called a probe).

FIG. 10 is a vertical sectional view showing an electrical contactor 1 described in patent document 1. The vertical section of FIG. 10 is cut at a plane passing through the central axis of the electrical contactor 1.

The electrical contactor 1 has a conductive barrel 2 and a conductive plunger 3. The barrel 2 has a substantially cylindrical shape. The barrel 2 has two spring parts including a spring part 2b and a spring part 2d that exert elastic forces in the vertical direction (longitudinal direction). Specifically, the barrel 2 has an upper part 2a, the upper spring part 2b, an intermediary part 2c, the lower spring part 2d, and a lower part 2e arranged in this order as viewed from the top. The plunger 3 has a substantially cylindrical columnar shape. The inner diameter of the barrel 2 and the outer diameter of the plunger 3 is substantially the same. The plunger 3 is mostly inserted in internal space of the barrel 2. The plunger 3 is inserted in the internal space of the barrel 2 such that the upper end of the plunger 3 does not protrude outside the barrel 2 from the upper part 2a regardless of the presence or absence of application of external force on the electrical contactor 1. A lower part of the plunger 3 protrudes downward further than the lower part 2e of the barrel 2. The lower part 2e and the plunger 3 are bonded and fixed to each other for example by resistance welding, laser welding, or swaging in a position (indicating not one point but several points or a circle) P at a given height of the lower part 2e of the barrel 2.

For use of the electrical contactor 1 integrated in an electrical connecting apparatus, the upper end of the barrel 2 is electrically connected to an external electrode or the like not shown in the drawings above the barrel 2 and the lower end of the plunger 3 is electrically connected to an external electrode or the like not shown in the drawings below the plunger 3 while the spring parts 2b and 2d of the barrel 2 store energy and exert elastic forces in the vertical direction in response to application of external force.

SUMMARY OF THE INVENTION

As described above, the electrical contactor 1 described in patent document 1 is electrically connected to an external electrode or the like at the upper end having the shape of a circular ring of the barrel 2. The electrical contactor 1 has a length of some millimeters so the diameter of the upper end having the shape of a circular ring is considerably small. Flattening this upper end might distort the circular ring of the upper end. Thus, the end surface is not flattened. Even if the end surface is to be flattened, the flattening proceeds gently. As a result, the upper end having the shape of a circular ring of the barrel 2 becomes rough, so that resistance of contact with an external electrode or the like varies among the electrical contactor and does not become stable. Performance of electrical contact is worsened particularly if the central axis is slightly tilted from the vertical direction or the external electrode is not flat sufficiently.

To form reliable contact, a probe conventionally makes the electrical contactor perform overdrive when the electrical contactor is moved for the contact. In response to the bad performance of electrical contact as described above, the amount of the overdrive might be increased or larger pressure might be applied during the overdrive. However, if the probe makes the electrical contactor 1 of patent document 1 perform overdrive more strongly in the aforementioned way, some electrical contactor has deformed in a position corresponding to a spring part resulting from the presence of the spring parts in the barrel 2.

This invention is intended to provide an electrical contactor capable of achieving satisfactory performance of electrical contact with a small number of elements and an electrical connecting apparatus employing such an electrical contactor.

This invention is further intended to provide an electrical contactor capable of suppressing deformation to occur during contact and an electrical connecting apparatus employing such an electrical contactor.

A first aspect of this invention is directed to an electrical contactor to form electrical connection between a first contact target and a second contact target. The electrical contactor includes: (1) a barrel having a spring part achieving a spring function, the spring part being formed in a partial section in a longitudinal direction; (2) a first plunger inserted at least partially in the barrel through one end of the barrel, the first plunger being to electrically contact the first contact target; and (3) a second plunger inserted at least partially in the barrel through an opposite end of the barrel to close an opening at the opposite end of the barrel, the second plunger being to electrically contact the second contact target.

A second aspect of this invention is directed to an electrical contactor to form electrical connection between a first contact target and a second contact target. The electrical contactor includes: (1) a barrel having a spring part achieving a spring function and a non-spring part not to achieve a spring function, the spring part and the non-spring part being arranged in a line in a longitudinal direction, the spring part including three or more spring parts separated while the non-spring parts are placed between the spring parts; and (2) a plunger inserted at least partially in the barrel through one end of the barrel, the plunger being to electrically contact the first contact target.

A third aspect of this invention is directed to an electrical connecting apparatus including multiple electrical contactors to form electrical connection between a first contact target and a second contact target. At least some of the electrical contactors are the electrical contactor according to the first or second aspect of this invention.

The first aspect of this invention can realize an electrical contactor capable of achieving satisfactory performance of electrical contact with a small number of elements. The second aspect of this invention can realize an electrical contactor capable of suppressing deformation to occur during contact. The third aspect of this invention can realize an electrical connecting apparatus employing the electrical contactor according to the first or second aspect of this invention.

BRIEF DESCRIPTION OF DRAWINGS

FIGS. 5A, 5B, and 5C are front views each showing the upper end and its vicinity of a top plunger of the electrical contactor of the first embodiment.

FIG. 6 is an explanatory view showing a result of measurement conducted to determine a relationship between the number of spring parts provided to the barrel and the amount of deformation.

Figure 1:
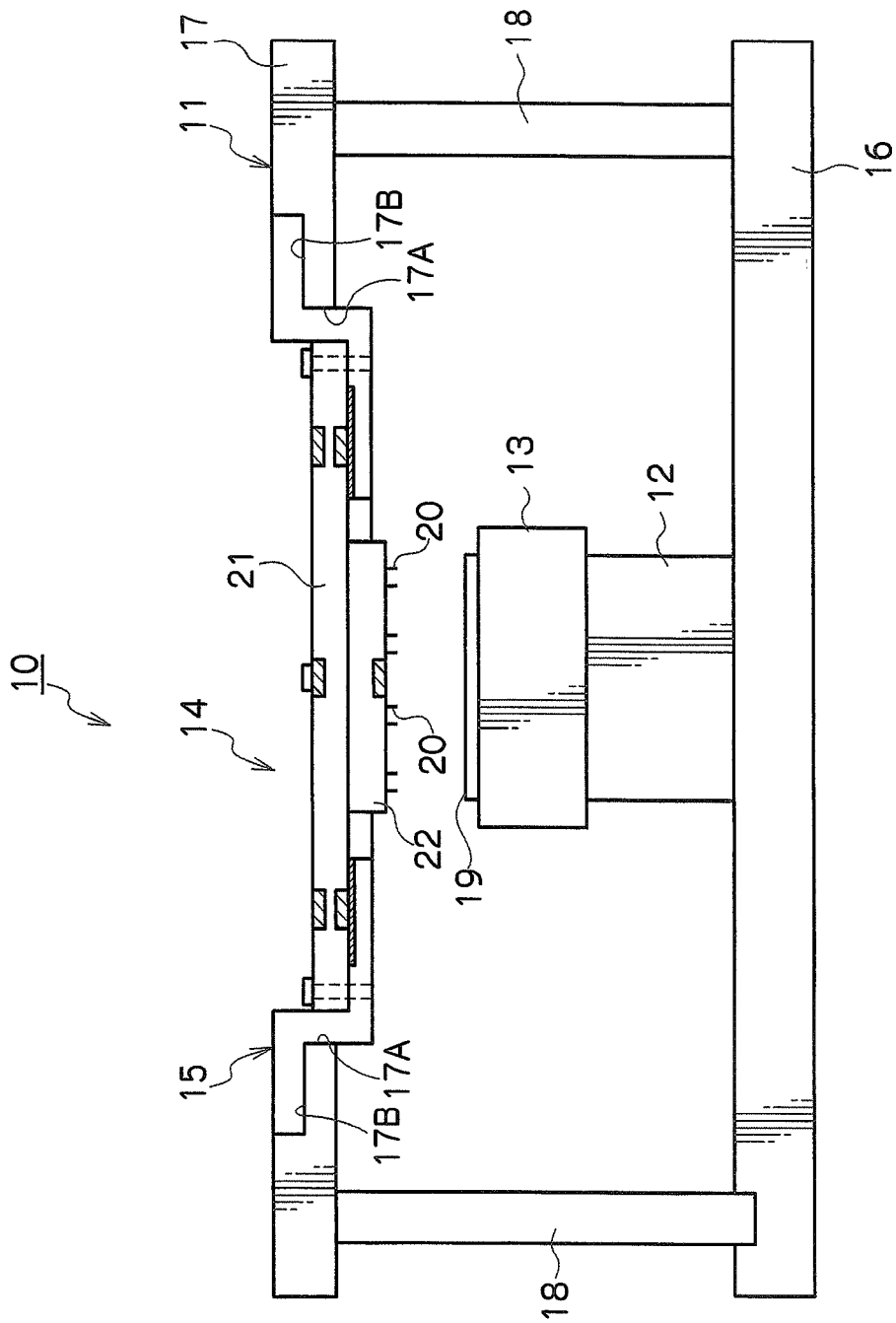
FIG. 1 is a front view schematically showing the structure of an inspection device including an electrical connecting apparatus employing an electrical contactor of a first embodiment in combination of a partial sectional view.

DETAILED DESCRIPTION OF THE PREFERRED EMBODIMENTS (A) First Embodiment

A first embodiment of an electrical contactor and that of an electrical connecting apparatus according to this invention are described below by referring to the drawings.

An inspection device (called a prober in many cases) including the electrical connecting apparatus of the first embodiment employing the electrical contactor of the first embodiment is described first by referring to FIG. 1. The inspection device is not limited to one installed in a way shown in FIG. 1. The "vertical direction" in the following description given by referring to FIG. 1 and subsequent drawings means the vertical direction of FIG. 1.

An inspection device 10 mainly includes a device body 11, an XYXθ stage 12, a chuck 13, a card connector (called a probe card in many cases) 14, and a connector holder 15.

The device body 11 is a member to support the XYXθ stage 12, the card connector 14 and the like. The device body 11 mainly includes a lower base 16, an upper base 17, and multiple supports 18 supporting space between the lower and upper bases 16 and 17. An opening 17A is formed in the center of the upper base 17. The opening 17A has a shape such as a circle or a rectangle (in the below, the shape of the opening 17A is described as a circle) similar to the outer shape of the card connector 14. A stepped recess 17B for attachment of the connector holder 15 is provided at an upper side of the inner periphery of the opening 17A.

The XYXθ stage 12 is to move the chuck 13 in the X-axis direction, Y-axis direction, or Z-axis direction, and rotate the chuck 13. The chuck 13 is a mechanism to hold a test object 19 such as a wafer by means of vacuum suction, for example.

The card connector 14 is a member to form electrical connection between the test object 19 and a tester (not shown in the drawings). The card connector 14 has a disc wiring substrate 21 and a contact support substrate (corresponding to the electrical connecting apparatus of the first embodiment) 22.

The wiring substrate 21 is a member for arranging a signal line or the like connected with an electrical contactor 20. The wiring substrate 21 is attached through the connector holder 15 to the device body 11 to support the entire contact support substrate 22 arranged below the wiring substrate 21.

The contact support substrate 22 is a member to support a large number of electrical contactors 20. The contact support substrate 22 is formed into a shape such as a circle or a rectangle. The contact support substrate 22 has an upper side surface formed integrally with the lower side surface of the wiring substrate 21. The electrical contactors 20 in large numbers are attached to the contact support substrate 22.

Each electrical contactor 20 is provided in a position corresponding to an electrode pad (not shown in the drawings) of a semiconductor device formed on the test object 19, for example. For conduction of a test, the electrical contactor 20 contacts an electrode pad or the like of the test object 19 placed on the upper side surface of the chuck 13 controlled by the XYXθ stage 12.

Figure 2:
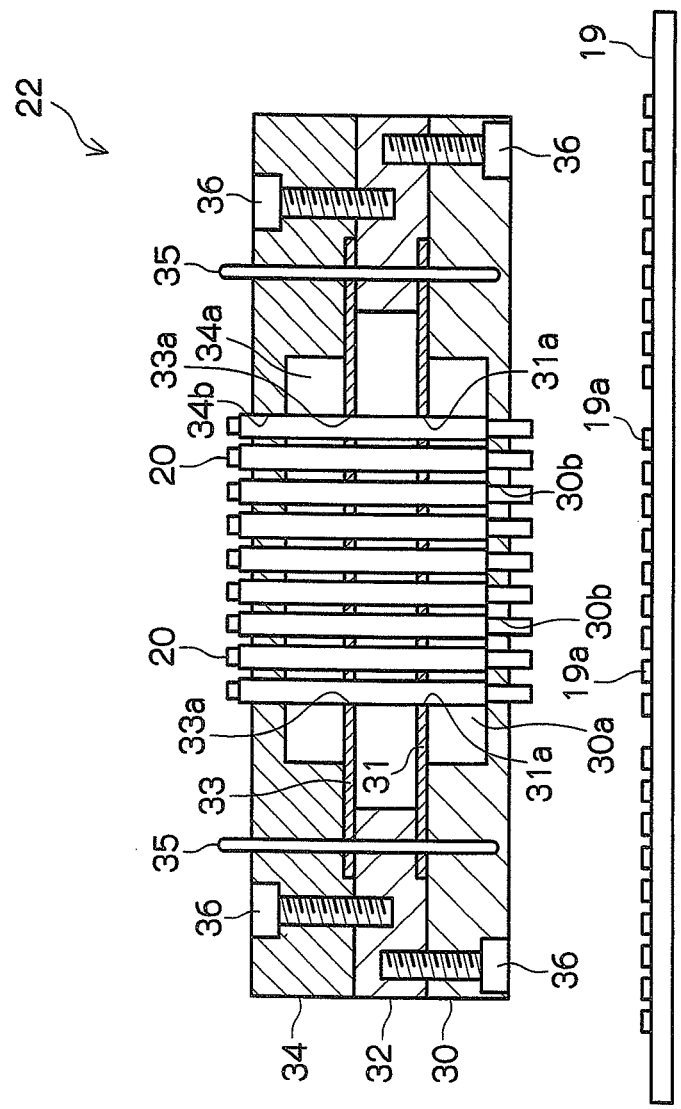
FIG. 2 is a vertical sectional view schematically showing the electrical connecting apparatus (contact support substrate) of the first embodiment.
Figure 3:
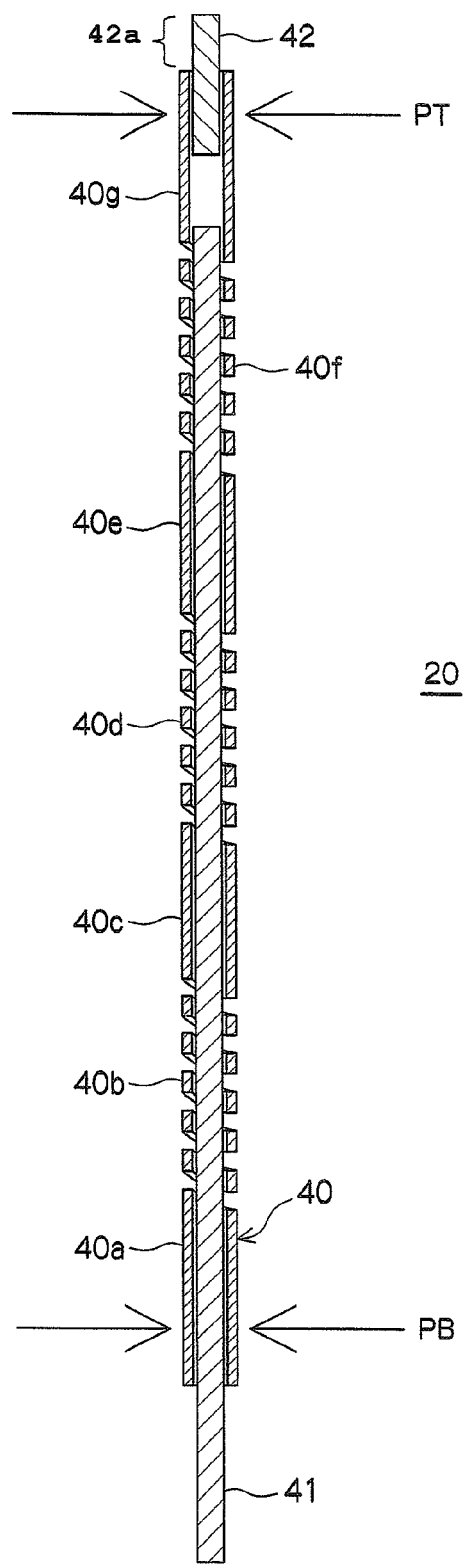
FIG. 3 is a vertical sectional view schematically showing the electrical contactor of the first embodiment.

FIG. 2 is a vertical sectional view schematically showing the structure of the contact support substrate 22. For the sake of simplicity of illustration, nine electrical contactors 20 are shown in FIG. 2. Meanwhile, as described above, the contact support substrate 22 supports a large number of electrical contactors 20. FIG. 2 shows one cavity where a group of electrical contactors 20 is attached. Alternatively, the contact support substrate 22 may include multiple cavities and a group of electrical contactors 20 may be attached to each cavity. Multiple electrical contactors 20 are not always aligned in a row in each cavity but they can be arranged in any pattern such as a matrix as viewed in the vertical direction. The specific structure of the electrical contactors 20 is shown in FIG. 3 referred to later. FIG. 2 is to mainly show the arrangement of the electrical contactors 20 and does not show the structure of the electrical contactor 20 exactly.

The contact support substrate 22 has a bottom guide plate 30, a lower insulating sheet 31, an intermediary spacer 32, an upper insulating sheet 33, a top guide plate 34, guide pins 35, and fixing screws 36.

The bottom guide plate 30 is a support member to hold a lower part of each electrical contactor 20 in its position and to allow sliding motion of the electrical contactor 20. Specifically, the bottom guide plate 30 is a guide that holds the position of the lower part of each electrical contactor 20. The bottom guide plate 30 is formed as a flat plate having a downwardly opening recess 30a formed in its center. The recess 30a is provided with lower part support holes 30b supporting the lower parts of the electrical contactors 20 while letting the lower parts pass through. The lower part support holes 30b are provided in positions conforming to corresponding electrode pads 19a of the test object 19 so as to be responsive to the corresponding electrode pads 19a. This makes the lower part of each electrical contactor 20 fit in a corresponding lower part support hole 30b, thereby forming contact of a lower end part of each electrical contactor 20 with a corresponding electrode pad 19a of the test object 19. As a result of the function of each electrical contactor 20 to expand and contract described later, the lower part of each electrical contactor 20 makes sliding motion while passing through a corresponding lower part support hole 30b in response to the expansion and contraction of the electrical contactor 20. The bottom guide plate 30 is formed for example of ceramic and has insulating properties.

The lower insulating sheet 31 is a member to prevent a short-circuit between adjacent electrical contactors 20 and to maintain the verticality of each electrical contactor 20. The lower insulating sheet 31 is configured to have a small thickness using a synthetic resin film of excellent resistance to abrasion and heat such as a polyimide film, for example.

The lower insulating sheet 31 is provided with guide holes 31a formed in positions conforming to corresponding lower part support holes 30b in the bottom guide plate 30 so as to be responsive to the corresponding lower part support holes 30b. The diameter of the guide holes 31a is set to be substantially the same as the outer diameter of the electrical contactors 20. This allows the electrical contactors 20 to be inserted in the guide holes 31a and supported reliably therein without being shaken. The lower insulating sheet 31 supports an intermediary part on a lower side of each electrical contactor 20.

The lower insulating sheet 31 is held and supported at its peripheral part between the bottom guide plate 30 and the intermediary spacer 32. The position of the lower insulating sheet 31 in the vertical direction is described clearly later in the description of the specific structure of the electrical contactors 20.

The intermediary spacer 32 is a member to keep a certain distance between the lower and upper insulating sheets 31 and 33, and to support the lower and upper insulating sheets 31 and 33 by holding between the intermediary spacer 32 and the bottom guide plate 30 and between the intermediary spacer 32 and the top guide plate 34. The intermediary spacer 32 is formed into a thick annular shape. The intermediary spacer 32 is formed for example as a circular ring or a rectangular ring to conform to the shape of the bottom guide plate 30. The thickness of the intermediary spacer 32 is selected so as to place the lower and upper insulating sheets 31 and 33 in their certain positions in the vertical direction.

Like the lower insulating sheet 31, the upper insulating sheet 33 is a member to prevent a short-circuit between adjacent electrical contactors 20 and to maintain the verticality of each electrical contactor 20. The upper insulating sheet 33 is also formed to have a small thickness using a synthetic resin film of excellent resistance to abrasion and heat such as a polyimide film, for example.

The upper insulating sheet 33 is provided with guide holes 33a formed in positions conforming to corresponding guide holes 31a in the lower insulating sheet 31 so as to be responsive to the corresponding guide holes 31a. The diameter of the guide holes 33a is set to be substantially the same as the outer diameter of the electrical contactors 20. This allows the electrical contactors 20 to be inserted in the guide holes 33a and supported reliably therein without being shaken. The upper insulating sheet 33 supports an intermediary part on an upper side of each electrical contactor 20.

The upper insulating sheet 33 is held and supported at its peripheral part between the intermediary spacer 32 and the top guide plate 34. The position of the upper insulating sheet 33 in the vertical direction is described clearly later in the description of the specific structure of the electrical contactors 20.

The top guide plate 34 is a support member to hold an upper part of each electrical contactor 20 in its position and to allow sliding motion of the electrical contactor 20. Specifically, the top guide plate 34 is a guide that holds the position of the upper part of each electrical contactor 20. The top guide plate 34 is formed as a flat plate having an upwardly opening recess 34a formed in its center. The recess 34a is provided with upper part support holes 34b supporting the upper parts of the electrical contactors 20 while letting the upper parts pass through. The upper part support holes 34b are provided in positions conforming to corresponding guide holes 33a in the upper insulating sheet 33 and conforming to corresponding electrodes of the wiring substrate 21 not shown in the drawings so as to be responsive to the corresponding electrodes of the wiring substrate 21. This makes the upper part of each electrical contactor 20 fit in a corresponding upper part support hole 34b, thereby forming contact of an upper end part of each electrical contactor 20 with a corresponding electrode of the wiring substrate 21. As a result of the function of each electrical contactor 20 to expand and contract described later, the upper part of each electrical contactor 20 makes sliding motion while passing through a corresponding upper part support hole 34b in response to the expansion and contraction of the electrical contactor 20. The top guide plate 34 is formed for example of ceramic and has insulating properties.

The top guide plate 34 may be replaced by a spacer formed as a circular ring or a rectangular ring, for example (see Japanese Patent Laid-Open No. 2011-145279).

The guide pins 35 are used to hold at least the bottom guide plate 30, the intermediary spacer 32, and the top guide plate 34 in their exact positions relative to each other when the bottom guide plate 30, the intermediary spacer 32, and the top guide plate 34 are placed one above the other. The guide pins 35 may further penetrate a different constituting element of the card connector 14 not shown in the drawings to place this element in its position.

The fixing screws 36 are used to fix the entire contact support substrate 22 integrally. The bottom guide plate 30, the lower insulating sheet 31, the intermediary spacer 32, the upper insulating sheet 33, and the top guide plate 34 are fixed integrally with the fixing screws 36 such that they are arranged detachably. As a result, the insulating sheets 31 and 33, and the intermediary spacer 32 can be replaced appropriately.

FIG. 3 is a sectional view showing the structure of the electrical contactor 20 of the first embodiment. FIG. 3 shows a vertical section cut at a plane passing through the central axis of the electrical contactor 20.

The electrical contactor 20 has a barrel 40, a bottom plunger 41, and a top plunger 42. The barrel 40, and the bottom and top plungers 41 and 42 are all made of a conductive material.

The barrel 40 has a substantially cylindrical shape. The barrel 40 of the electrical contactor 20 of the first embodiment has three spring parts including a spring part 40b, a spring part 40d, and a spring part 40f that exert elastic forces in the vertical direction (longitudinal direction). The other part of the electrical contactor 20 is formed of a non-spring part 40a, a non-spring part 40c, a non-spring part 40e, and a non-spring part 40g that do not exert elastic force. Specifically, the barrel 40 has the first non-spring part 40a, the first spring part 40b, the second non-spring part 40c, the second spring part 40d, the third non-spring part 40e, the third spring part 40f, and the fourth non-spring part 40g arranged in this order as viewed from the bottom.

The electrical contactor 20 can exert intended elastic force in the vertical direction by the presence of the three spring parts 40b, 40d, and 40f. If the aim is only to exert the intended elastic force, providing one spring part of a length same as a total of the lengths of the three spring parts 40b, 40d, and 40f will do. In the first embodiment, however, the three spring parts 40b, 40d, and 40f are provided for the following reason.

The opposite ends of the electrical contactor 20 are made to contact the electrode pad 19a of the test object 19 and the electrode of the wiring substrate 21 (FIG. 1) by moving up the test object 19 (see FIG. 2). At this time, the test object 19 is moved up further slightly (performed overdrive on) after these contacts are formed to make the contacts more reliable. Resistive force on the electrical contactor 20 increases during the overdrive. If the direction of the resistive force shifts from the vertical direction even slightly in the presence of a long spring part, an electrical contactor is likely to deform at this spring part in a direction perpendicular to the vertical direction. Such deformation becomes less likely with a shorter length of a spring part.

As described above, the verticality of the electrical contactor 20 is maintained not only at its lower and upper parts but also at its intermediary part by the lower and upper insulating sheets 31 and 33. If the electrical contactor 20 contacts the lower or upper insulating sheet 31 or 33 at its spring part, overdrive of the electrical contactor 20 or releasing the electrical contactor 20 from the overdrive hinders movement of the electrical contactor 20 in the vertical direction. Thus, it is preferable that the electrical contactor 20 contacts the lower or upper insulating sheet 31 or 33 at its non-spring part. Providing the three spring parts 40b, 40d, and 40f is an appropriate way of making the electrical contactor 20 contact the lower or upper insulating sheet 31 or 33 at its non-spring part. The electrical contactor 20 may contact the lower and upper insulating sheets 31 and 33 at the same non-spring part and the electrical contactor 20 may have two spring parts. However, this increases the probability of deformation to occur during the aforementioned overdrive, compared to provision of three spring parts.

Figures 4A, 4B:
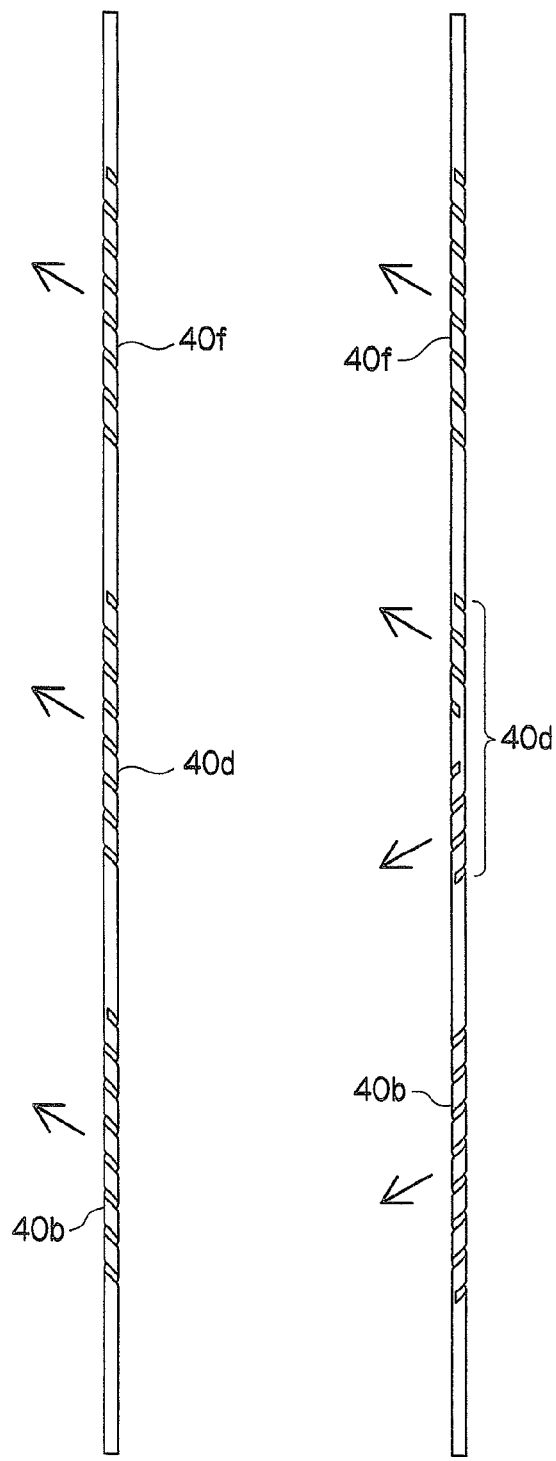
FIGS. 4A and 4B are front views each showing a barrel of the electrical contactor of the first embodiment.

FIGS. 4A and 4B are front views each showing the barrel 40 of the electrical contactor 20 of the first embodiment. If rotation of the electrical contactor 20 of the first embodiment about the central axis resulting from the up-and-down movement does not raise any issue, all the three spring parts 40b, 40d, and 40f of the barrel 40 may have the same helical shape as shown in FIG. 4A. If rotation of the electrical contactor 20 of the first embodiment about the central axis resulting from the up-and-down movement raises some issue, the three spring parts 40b, 40d, and 40f of the barrel 40 may have helical shapes of the same length pointing in different directions as shown in FIG. 4B. In the example of FIG. 4B, the helical shape of the spring part 40b is diagonally right up, that of the spring part 40f is diagonally left up, and the spring part 40d is equally divided into a diagonally right-up helical shape and a diagonally left-up helical shape.

The bottom plunger 41 has a substantially cylindrical columnar shape. The outer diameter of the bottom plunger 41 is substantially the same as the inner diameter of the barrel 40. The bottom plunger 41 is inserted upward through the barrel 40 from an opening at the lower end of the barrel 40.

A lower part 41a of the bottom plunger 41 protrudes downward from the lower end of the barrel 40. The protruded length of the lower part 41a is selected such that the lower part 41a passing through the lower part support hole 30b in the bottom guide plate 30 can contact the electrode pad 19a of the test object 19. A step formed at the lower end of the barrel 40 as a result of the protrusion of the bottom plunger 41 from the lower end of the barrel 40 fits an upper surface (inner surface) area of the bottom guide plate 30 around the lower part support hole 30b, thereby preventing the electrical contactor 20 from coming off from the lower part support hole 30b. The diameter of the lower part support hole 30b in the bottom guide plate 30 is substantially the same as the outer diameter of the bottom plunger 41.

The bottom non-spring part 40a of the barrel 40 and the bottom plunger 41 are bonded and fixed to each other for example by resistance welding (spot welding), laser welding, or swaging in a position (indicating not one point but several points or a circle in the circumferential direction; the points mentioned herein are not limited to fine points but they may define a region covering a bonding region such as an oval elongated in the longitudinal direction, for example) PB at a given height of the non-spring part 40a. If the resistance welding is employed, the barrel 40 and the bottom plunger 41 may be plated with the same material (such as gold for example) at the entire region or a partial region of the inner circumferential surface of the barrel 40 and a partial region of the outer circumferential surface of the bottom plunger 41, thereby bonding the barrel 40 and the bottom plunger 41 more rigidly by the resistance welding.

The upper end of the bottom plunger 41 reaches the inside of the top non-spring part 40g even if external force to act in the vertical direction is not applied on the electrical contactor 20. Most of the part of the bottom plunger 41 above the fixing point PB makes sliding motion relatively inside the barrel 40 in response to expansion and contraction of the spring parts 40b, 40d, and 40f.

The top plunger 42 has a substantially cylindrical columnar shape. The outer diameter of the top plunger 42 is substantially the same as the inner diameter of the barrel 40. The top plunger 42 passes downward through the barrel 40 from an opening at the upper end of the barrel 40. The diameter of the upper part support hole 34b in the top guide plate 34 is substantially the same as the outer diameter of the top plunger 42.

A substantially upper half part 42a of the top plunger 42 protrudes upward from the upper end of the barrel 40. The upper half part 42a protrudes an amount that is selected so as to assure that it is not the barrel 40 but the top plunger 42 that contacts the electrode of the wiring substrate 21 (FIG. 1). The top non-spring part 40g of the barrel 40 and the top plunger 42 are bonded and fixed to each other in a position PT at a given height of the non-spring part 40g. The barrel 40 and the top plunger 42 are bonded by a method same as the aforementioned method of bonding the barrel 40 and the bottom plunger 41.

The length of the upper part support hole 34b in the top guide plate 34 and that of the top non-spring part 40g of the barrel 40 are selected such that the non-spring part 40g passes through the upper part support hole 34b in the absence of application of external force on the electrical contactor 20 to act in the vertical direction. The length of the upper part support hole 34b and that of the top non-spring part 40g of the barrel 40 are also selected such that the non-spring part 40g is still partially placed in the upper part support hole 34b even if the upper end of the top plunger 42 becomes substantially flush with the upper surface of the top guide plate 34 in response to application of external force on the electrical contactor 20 acting in the vertical direction.

FIGS. 5A, 5B, and 5C are front views each showing the upper end and its vicinity of the top plunger 42 of the electrical contactor of the first embodiment.

Unlike in a conventional electrical contactor, in the electrical contactor 20 of the first embodiment, it is not the upper end of a barrel but the upper end of the top plunger 42 that contacts the electrode of the wiring substrate 21. Thus, the shape of the upper end of the top plunger 42 can be selected according to the shape of the electrode of the wiring substrate 21, for example. The conventional electrical contactor contacts an electrode of a wiring substrate at the upper end of a barrel, specifically at a circular ring. Thus, there is no room for selection of the shape of the upper end of the barrel according to the shape of the electrode of the wiring substrate, for example. In the first embodiment, the shape of the upper end of the top plunger 42 that is to contact the electrode of the wiring substrate 21 can be selected. As an example, the upper end of the top plunger 42 may be formed into a flat shape as shown in FIG. 5A, a shape formed by chamfering a flat shape as shown in FIG. 5B, or a semispherical shape as shown in FIG. 5C.

The lower end of the top plunger 42 is placed inside the top non-spring part 40g in the absence of application of external force on the electrical contactor 20 to act in the vertical direction.

A gap between the upper end of the bottom plunger 41 and the lower end of the top plunger 42 becomes maximum in the absence of application of external force on the electrical contactor 20 to act in the vertical direction. The length of the bottom plunger 41 and the position of the upper end of the bottom plunger 41, the length of the top plunger 42 and the position of the lower end of the top plunger 42, the length of the non-spring part 40g and the like are selected such that the gap is still maintained between the upper end of the bottom plunger 41 and the lower end of the top plunger 42 even during the aforementioned overdrive condition where external force on the electrical contactor 20 acts most intensively in the vertical direction.

The cylindrical columnar bottom and top plungers 41 and 42 may be solid or hollow. The bottom and top plungers 41 and 42 may be made of different materials.

For conducting a test on a new test object 19, the test object 19 is moved up together with the chuck 13 holding the test object 19 thereon by the XYXθ stage 12. Then, the electrode pad 19a of the test object 19 contacts the lower end of the bottom plunger 41 of the electrical contactor 20 while the upper end of the top plunger 42 of the electrical contactor 20 and the electrode of the wiring substrate 21 contact each other more tightly. From this time, the test object 19 is moved up by a given amount to generate overdrive condition. The spring parts 40b, 40d, and 40f of the barrel 40 fixed to the bottom plunger 41 in the position PB and to the top plunger 42 in the position PT are compressed as a result of the overdrive, thereby exerting resistive forces in the vertical direction by their elastic forces. This forms reliable contact between the electrode pad 19a of the test object 19 and the lower end of the bottom plunger 41 of the electrical contactor 20 and between the upper end of the top plunger 42 and the electrode of the wiring substrate 21. While the contacts are established in this way, the electrode pad 19a of the test object 19 and the electrode of the wiring substrate 21 are electrically connected via the bottom plunger 41, the barrel 40, and the top plunger 42.

After the test on the current test object 19 is finished, the test object 19 is moved down to break off contact between the electrode pad 19a of the test object 19 and the lower end of the bottom plunger 41 of the electrical contactor 20. In response, the spring parts 40b, 40d, and 40f of the barrel 40 expand to be on standby to be switched to a condition waiting for a test on a next test object 19.

In the first embodiment, provision of the top plunger to contact the wiring substrate achieves satisfactory performance of electrical contact and reduces variation between products. Contact resistance of a conventional electrical contactor was measured using a large number of samples (500 or more). The contact resistance varied in a range from 1Ω to 13Ω (resistance value was measured in units of one ohm) with a mode of 3Ω. Contact resistance of the electrical contactor 20 of the first embodiment was also measured using a large number of samples (500 or more). The contact resistance varied in a range from 1Ω to 2Ω with a mode of 1Ω.

These results show that the electrical contactor of the first embodiment is applicable to a part where severe electrical characteristics are to be identified with a value measured in this part.

The electrical contactor of the first embodiment additionally includes the top plunger as one of constituting elements. Meanwhile, the number of the constituting elements is still three so the electrical contactor can be manufactured easily.

In the first embodiment, the barrel 40 includes three spring parts and the bottom plunger 41 passes through all the three spring parts 40b, 40d, and 40f of the barrel 40. Thus, even on the occurrence of overdrive, deformation can still be prevented for example in a direction perpendicular to the vertical direction.

The present inventor conducted measurement to determine a relationship between the number of spring parts of a barrel and the amount of deformation. FIG. 6 is an explanatory view showing the result thereof.

Five types of measuring barrels made of pure nickel (pure Ni) of a length of 5.7 mm, an outer diameter of 70 μm, and an inner diameter of 54 μm were prepared that differ in the number of spring parts. These barrels were prepared by the method described in patent document 1. The number of spring parts were 1, 2, 3, 4, and 5. A total of the lengths of all the spring parts was set to 3.2841 mm in the barrels of all the types. Except for the number of spring parts, the measuring barrels have specifications substantially the same as those of an actually available product. One end of each measuring barrel was fixed and the measuring barrel was pushed only by 200 μm in the longitudinal direction of the barrel from the opposite end of the barrel. FIG. 6 shows a distance from the central axis of the barrel to a place farthest from the central axis in the perpendicular direction (this distance is hereinafter called a deformation amount). In the barrels of all the types, the place farthest from the central axis of the barrel in the perpendicular direction was a place corresponding to a central portion of a spring part.

The deformation amount of the measuring barrel having one spring part was 442.34 μm and that of the measuring barrel having two spring parts was 170.51 μm. These deformations were recognized visually. The deformation amount of the measuring barrel having three spring parts was 10.75 μm that is 1/16 of that of the measuring barrel having two spring parts. The deformation amount of the measuring barrel having four spring parts was 7.20 μm and that of the measuring barrel having five spring parts was 4.28 μm. The measuring barrel having three spring parts and those having more spring parts were deformed by respective amounts that could not be recognized visually.

The bottom plunger 41 passes through most of the inside of the barrel 40 and the bottom plunger 41 functions to prevent deformation in a direction perpendicular to the longitudinal direction (vertical direction). Nevertheless, in order to prevent deformation, it is preferable that the barrel 40 itself be highly resistant to deformation. Specifically, it is preferable that a barrel be divided into three spring parts by placing non-spring parts between the spring parts like the barrel 40 of the first embodiment. It is also preferable that the barrel be divided into more spring parts.

In the first embodiment, the electrical contactor 20 is held not only by the bottom and top guide plates 30 and 34 but also by the lower and upper insulating sheets 31 and 33 at the non-spring parts 40c and 40e of the barrel 40. Thus, the electrical contactor 20 can stably be held vertically to allow external force to act stably on the electrical contactor 20 in the vertical direction, thereby preventing deformation of the electrical contactor 20.

(B) Different Embodiments

The various modified embodiments are shown in the aforementioned description of the first embodiment. Additional modified embodiments shown below are still applicable.

Figure 7:
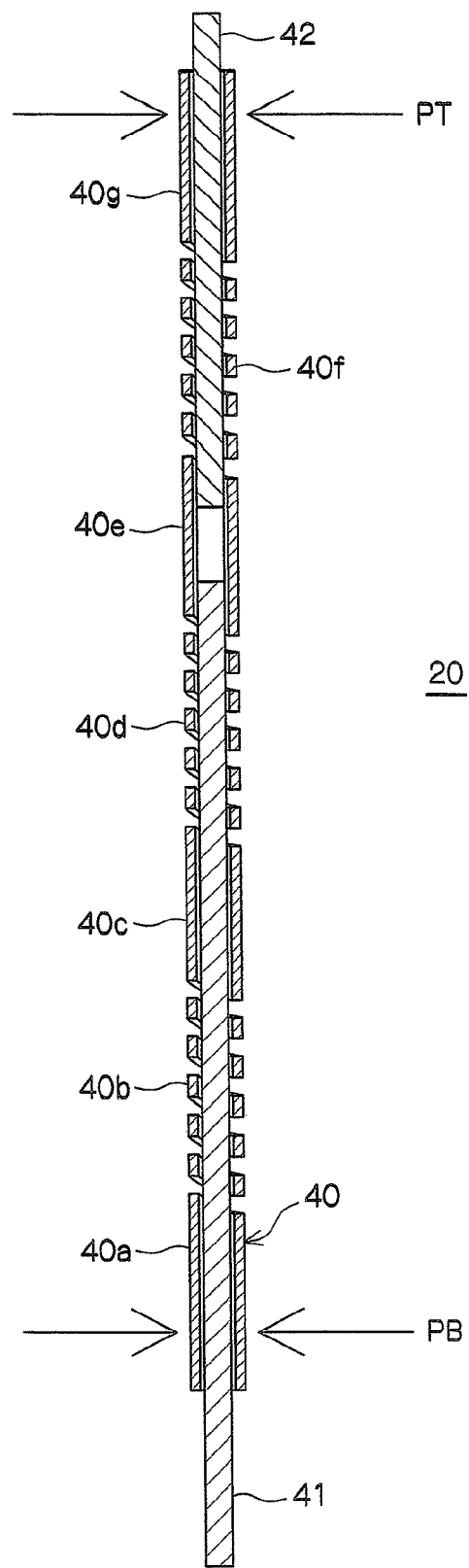
FIG. 7 is a vertical sectional view schematically showing an electrical contactor of a modified embodiment devised by changing the length of a bottom plunger and that of the top plunger of the first embodiment.

In the first embodiment, the length of the bottom plunger 41, that of the top plunger 42 and the like are selected such that the upper end of the bottom plunger 41 and the lower end of the top plunger 42 reach the inside of the top non-spring part 40g of the barrel 40. Alternatively, the length of the bottom plunger 41, that of the top plunger 42 and the like may be selected such that the upper end of the bottom plunger 41 and the lower end of the top plunger 42 reach the inside of a different non-spring part such as the non-spring part 40a, 40c, or 40e of the barrel 40. As shown in FIG. 7, for example, the length of the bottom plunger 41, that of the top plunger 42 and the like may be selected such that the upper end of the bottom plunger 41 and the lower end of the top plunger 42 reach the inside of the second non-spring part 40e from the top of the barrel 40.

Figure 8A:
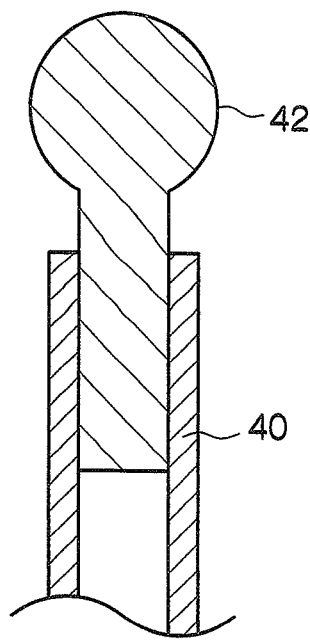
FIGS. 8A, 8B, and 8C are vertical sectional view each schematically showing the upper and its vicinity of a top plunger of an electrical contactor of a modified embodiment devised by changing the shape or position of the upper end of the top plunger of the first embodiment.
Figure 8B:
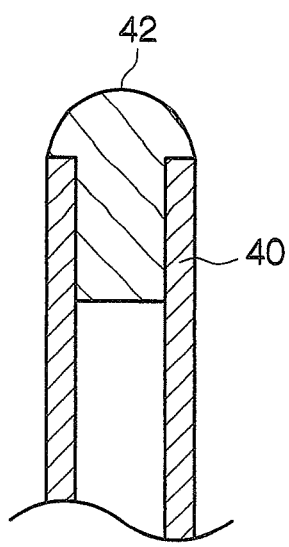
Figure 8C:
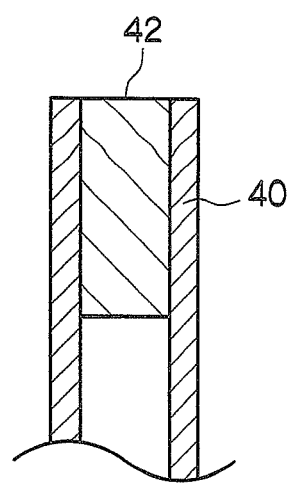

In the first embodiment, the cylindrical columnar top plunger 42 is described as a member of the electrical contactor 20 contacting the electrode of the wiring substrate 21. The upper end of the barrel 40 can be replaced by any member that can contact the electrode of the wiring substrate 21. Such a member is not limited in terms of its shape, for example. As an example, the member may have a top-heavy shape such as that shown in FIG. 8A with an upper end part of the cylindrical column larger than the outer diameter of the cylindrical column. Alternatively, the member may be a lid body such as that shown in FIG. 8B closing an opening at the upper end of the barrel 40. Still alternatively, the member may a stopper member such as that shown in FIG. 8C to convert the circular ring at the upper end of the barrel 40 to a plane. In the claims, the lid body and the stopper member are collectively called a "second plunger."

The electrical contactor 20 of the first embodiment has the following significant features: provision of the top plunger 42 for better performance of electrical contact with the electrode of the wiring substrate 21 (first feature); and the barrel 40 has three spring parts (second feature; as described in the advantageous effects of the first embodiment, the number is not limited to three but it is simply required to be three or more). An electrical contactor may be formed to have only one of these two features.

Figure 9:
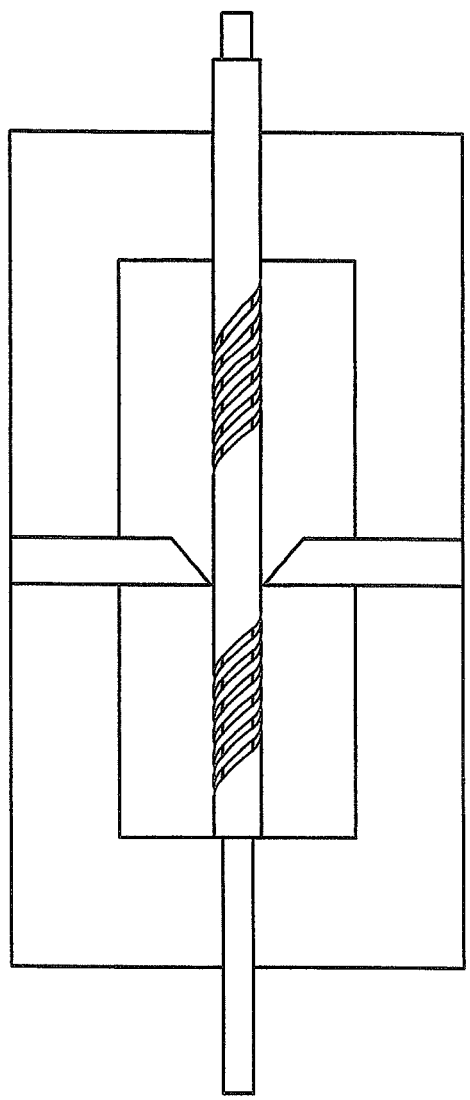
FIG. 9 is a vertical sectional view schematically showing an electrical connecting apparatus (contact support substrate) employing an electrical contactor of a modified embodiment devised by changing the number of spring parts from three as in the first embodiment to two.
Figure 10:
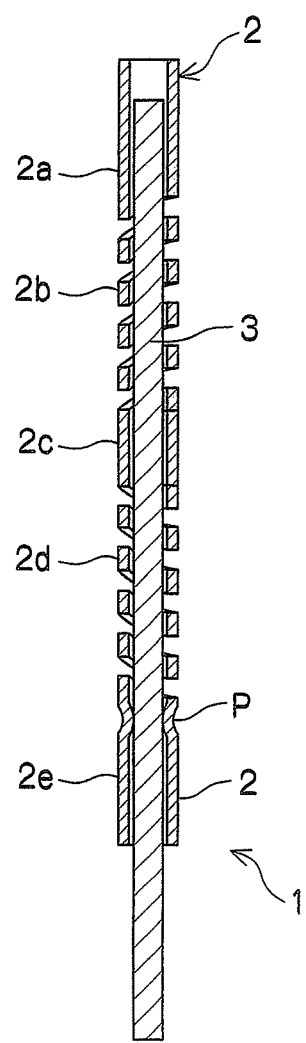
FIG. 10 is a vertical sectional view showing a conventional electrical contactor.

If the first feature is employed, the number of spring parts may be one or two, for example. If deformation is made less likely by the material, thickness or the like of the barrel 40, only providing the top plunger will do for better performance of electrical contact. FIG. 9 schematically shows the structure of a contact support substrate (electrical connecting apparatus) employing an electrical contactor having two spring parts. For the sake of simplicity of illustration, the contact support substrate is shown to employ only one electrical contactor. The contact support substrate of FIG. 9 holds the electrical contactor with a bottom guide plate, an intermediary insulating sheet, and a top guide plate. The intermediary insulating sheet holds a non-spring part formed at an intermediary part of the electrical contactor.

If the second feature is employed, an electrical contactor may not include the top plunger, for example. If a measurement signal is a digital signal and an electrical contactor is not required to have severe performance of transmitting the signal unlike the case of an analog signal, only introducing three or more spring parts of a barrel contributing to prevention of deformation will do. As an example, if a signal to be offered to a test is an analog signal, the electrical contactor of the first embodiment may be employed. If a signal to be offered to a test is a digital signal, an electrical contactor without the top plunger having three or more spring parts may be employed.

The electrical contactor of a circular sectional shape is shown in the first embodiment. Alternatively, the electrical contactor may have a different sectional shape such as a rectangle or an oval.

The electrical contactor of this invention is applicable to every apparatus to contact an electrode provided in a wiring substrate, a semiconductor integrated circuit or the like. The electrical connecting apparatus of this invention uses the electrical contactor of this invention at least in part of the apparatus and is not intended for use only in an inspection device.

The invention claimed is:

1. An electrical contactor to form electrical connection between a first contact target and a second contact target, the electrical contactor comprising:
   a barrel having a spring part achieving a spring function, the spring part being formed in a partial section in a longitudinal direction;
   a first plunger inserted at least partially in the barrel through one end of the barrel, the first plunger being adapted to electrically contact the first contact target; and
   a second plunger inserted at least partially in the barrel through an opposite end of the barrel to close an opening at the opposite end of the barrel, the second plunger being adapted to electrically contact the second contact target, wherein
   the barrel has three or more spring parts and a plurality of non-spring parts, the three or more spring parts being separated by respective ones of the non-spring parts that are placed between the spring parts,
   first and second ends of the barrel are formed by respective bottom and top ones of the non-spring parts,
   each of the first and second plungers has one end part that is situated within the barrel and one end part that protrudes from the barrel,
   the protruding end part of each of the first plunger electrically contacts the first contact target and the protruding end of the second plunger electrically contacts the second contact target, the end part of the first plunger that is in the barrel and the end part of the second plunger that is in the barrel are situated in an internal space of a same one of the non-spring parts of the barrel, such that the first and second plungers collectively extend through each of the spring parts and through or into each of the non-spring parts of the barrel, the spring parts and non-spring parts of the barrel are coaxial and a gap is formed between an end part of the second plunger that is in the barrel and an end part of the first plunger that is in the barrel, to permit axial movement of the first plunger relative to the second plunger, and a bottom one of the non-spring parts formed at a first end of the barrel is fixed to the first plunger and a top one of the non-spring parts formed at a second end of the barrel is fixed to the second plunger.

2. An electrical connecting apparatus comprising multiple electrical contactors to form electrical connection between a first contact target and a second contact target, wherein at least some of the electrical contactors are the electrical contactors as recited in claim 1.

3. An electrical connecting apparatus as claimed in claim 2, comprising multiple insulating sheets, wherein:

the electrical contactor is supported by guide holes of the multiple insulating sheets; and the non-spring parts and the spring parts of the electrical contactor are axially arranged such that the guide holes are contacted by the non-spring parts of the electrical contactor.

4. An electrical contactor as claimed in claim 1, wherein at least two of the spring parts have helical shapes that coil in different directions.

5. An electrical connecting apparatus comprising multiple electrical contactors to form electrical connection between a first contact target and a second contact target, wherein at least some of the electrical contactors are the electrical contactors as recited in claim 4.

* * * * *